(12) United States Patent
Yang et al.

(10) Patent No.: US 10,553,736 B2
(45) Date of Patent: Feb. 4, 2020

(54) PHOTOVOLTAIC POWER CONVERTER RECEIVER

(71) Applicant: MH GoPower Co., Ltd., Kaohsiung (TW)

(72) Inventors: Mei-huan Yang, Kaohsiung (TW);
Terry Zahuranec, Kaohsiung (TW);
Cheng-Liang Wu, Kaohsiung (TW);
Remigio Perales, Kaohsiung (TW);
Wei-Sheng Chao, Kaohsiung (TW);
Kuo-Hsien Wu, Kaohsiung (TW);
Ying-Lin Tseng, Kaohsiung (TW);
Mu-Kai Su, Kaohsiung (TW);
Jonathan Jackson, Kaohsiung (TW)

(73) Assignee: MH GO POWER COMPANY LIMITED, Kaosiung (TW)

( * ) Notice: Subject to any disclaimer, the term of this patent is extended or adjusted under 35 U.S.C. 154(b) by 500 days.

(21) Appl. No.: 14/789,054

(22) Filed: Jul. 1, 2015

(65) Prior Publication Data
US 2017/0005216 A1     Jan. 5, 2017

(51) Int. Cl.
*H01L 31/052*     (2014.01)
*H01L 31/047*     (2014.01)
*H01L 31/054*     (2014.01)

(52) U.S. Cl.
CPC .......... *H01L 31/047* (2014.12); *H01L 31/052* (2013.01); *H01L 31/054* (2014.12); *Y02E 10/52* (2013.01)

(58) Field of Classification Search
CPC ... H01L 31/047; H01L 31/054; H01L 31/052; H01L 31/0547

USPC .................................................. 136/242–265
See application file for complete search history.

(56) References Cited

U.S. PATENT DOCUMENTS

| | | | |
|---|---|---|---|
| 2009/0101207 A1* | 4/2009 | Milbourne | H01L 31/18 136/259 |
| 2011/0226332 A1* | 9/2011 | Ford | G02B 6/0053 136/259 |
| 2011/0247691 A1* | 10/2011 | Yu | H01L 31/055 136/259 |
| 2011/0297229 A1* | 12/2011 | Gu | G02B 6/4298 136/259 |
| 2012/0049242 A1* | 3/2012 | Atanackovic | H01L 31/02244 257/184 |
| 2012/0055552 A1* | 3/2012 | Morgan | H01L 31/18 136/259 |

(Continued)

OTHER PUBLICATIONS

Gover, et al.; Vertical Multijunction Solar-Cell One-Diminsional Analysis; IEEE Transactions on Electron Devices; Jun. 1974, vol. 2, No. 6.

(Continued)

*Primary Examiner* — Eli S Mekhlin
*Assistant Examiner* — Kourtney R S Carlson
(74) *Attorney, Agent, or Firm* — Pearne & Gordon LLP

(57) ABSTRACT

Provided is a photovoltaic power converter receiver, including a photovoltaic cell, a waveguide coupled to the photovoltaic cell, and an optical transmission device of which an end is coupled to the waveguide for transmitting an optical wave to the photovoltaic cell through the waveguide, wherein the end of the optical transmission device is offset from a longitudinal central axis of the waveguide by a distance $D_{offset}$.

14 Claims, 7 Drawing Sheets

(56) References Cited

U.S. PATENT DOCUMENTS

2014/0319377 A1* 10/2014 Morgan .............. H01L 31/0547
　　　　　　　　　　　　　　　　　　　　　　250/459.1

OTHER PUBLICATIONS

Carver; Back-Contact Vertical-Junction Solar Cell Thesis; Department of the Air Force; Air University; Air Force Institute of Technology, Wright-Patterson Air Force Base, Ohio.
Raible, et al.; Optical Frequency Optimization of a High Intensity Laser Power Beaming System Utilizing VMJ Photovoltaic Cells; NASA/TM-2012-217256; ISBN: 978-1-4244-9686-0; Mar. 2012.
Multi-Junction Solar Cells with Concentrators http://large.stanford.edu/courses/2012/ph240/maas2/.
Multi-junction Solar Cell, Wikipedia, Fig. C https://en.wikipedia.org/wiki/Multi-junction_solar_cell.

* cited by examiner

PHOTOVOLTAIC POWER CONVERTER RECEIVER

BACKGROUND

Field of Invention

The present disclosure is related to semiconductor devices sensitive to infrared (IR) radiation, light, or electromagnetic radiation of shorter wavelength and adapted for the conversion of the energy of such radiation. More particularly, the present disclosure is related to a photovoltaic power converter receiver.

Description of Related Art

There is a need to produce electricity from high-energy radiation sources such as lasers at visible light or near IR wavelengths between 400 nm and 1600 nm. This is typically used where it is desired to eliminate metallic wires and to isolate the power source from a device, so as to accomplish high voltage isolation, lightning protection, or usage in electromagnetic fields or harsh environmental/hazardous locations. It is also desired to operate electrical devices at the end of a laser fiber to power lights, IGBT's, cooling fans, peltier coolers, or other devices.

Typical photovoltaic (PV) cells are limited in their ability to accept this high level of energy. Current PV cells by their nature have output voltages typically less than or near to 1 $V_{DC}$. As the energy levels increase, the current within the PV cell also increases to reach the power level desired. The current level, however, is limited by the PV cell construction. Multiple cells can be used in series or matched to a dc-dc up converter to get the higher voltage desired. This approach, however, results in difficult manufacturing process or complex devices.

A vertical multi-junction (VMJ) photovoltaic cell is a photovoltaic cell that has an output voltage higher than a conventional single junction photovoltaic cell, and thus may be suitable for use in the aforementioned energy conversion application. However, to convert radiation energy from a laser beam having a non-uniform intensity profile with a VMJ cell, there are still some unique and critical issues needed to be solved.

SUMMARY

The present disclosure provides a photovoltaic power converter receiver, including a photovoltaic cell, a waveguide coupled to the photovoltaic cell, and an optical transmission device of which an end is coupled to the waveguide for transmitting an optical wave to the photovoltaic cell through the waveguide, wherein the end of the optical transmission device is offset from a longitudinal central axis of the waveguide by a distance $D_{offset}$.

In an embodiment, the photovoltaic cell is a vertical multi-junction (VMJ) photovoltaic cell.

In an embodiment, the photovoltaic power converter receiver further includes a header to which the photovoltaic cell is attached.

In an embodiment, the photovoltaic power converter receiver further includes a cap, wherein a hermetic seal is formed between the cap and the header.

In an embodiment, the cap includes a unit providing a pathway for the optical wave to arrive at the photovoltaic cell.

In an embodiment, the waveguide is disposed between the cap and the header so that the hermetic seal is formed between the cap, the waveguide, and the header.

In an embodiment, the waveguide has a rectangular inlet cross-section and a rectangular outlet cross-section.

In an embodiment, the area of the rectangular inlet cross-section is substantially equal to the area of the rectangular outlet cross-section.

In an embodiment, the area of the rectangular inlet cross-section is greater than the area of the rectangular outlet cross-section.

In an embodiment, the optical transmission device is movable along a direction parallel to the longitudinal central axis of the waveguide.

In an embodiment, the photovoltaic power converter receiver further includes an optical diffuser disposed on a light-receiving plane of the photovoltaic cell.

In an embodiment, the optical transmission device is a rectangular optic fiber.

The present disclosure further provides a photovoltaic power converter receiver, including a photovoltaic cell, a waveguide coupled to the photovoltaic cell, an optical transmission device of which an end is coupled to the waveguide for transmitting an optical wave to the photovoltaic cell through the waveguide, and a heat sink, wherein the photovoltaic cell is coupled to the heat sink.

In an embodiment, the photovoltaic cell is directly attached to the heat sink.

In an embodiment, the photovoltaic power converter receiver further includes a cap, wherein a hermetic seal is formed between the cap and the heat sink.

In an embodiment, the waveguide is disposed between the cap and the heat sink so that the hermetic seal is formed between the cap, the waveguide, and the heat sink In an embodiment, the end of the optical transmission device is offset from a longitudinal central axis of the waveguide by a distance $D_{offset}$.

In an embodiment, the photovoltaic power converter receiver further includes a header to which the photovoltaic cell is attached.

The present disclosure yet provides a photovoltaic power converter receiver, including a photovoltaic cell, a waveguide coupled to the photovoltaic cell, and an optical transmission device of which an end is coupled to the waveguide for transmitting an optical wave to the photovoltaic cell through the waveguide.

BRIEF DESCRIPTION OF THE DRAWINGS

The present disclosure can be more fully understood by reading the following detailed description of the embodiment, with reference made to the accompanying drawings as follows.

DETAILED DESCRIPTION

In the following description, directional or positional relation indicated by terms such as "at the center of," "on," "over," "under," "below," "in front of," "behind," "at the left of," and "at the right of" is the directional or positional relation with reference to the figures. These terms are used to simplify the description, and using these terms does not indicate or suggest a specific configuration or orientation for operation of the device or element being described. In addition, terms such as "first" and "second" are used for descriptive purpose and shall not be construed as indicating or suggesting an element is more significant than another. Unless otherwise specified, terms such as "mounted," "attached," and "connected" shall be construed in their broad sense. For example, "connected" includes "fixedly connected," "detachably connected," or "integrally connected"; it also includes "mechanically connected" or "electrically connected"; it further includes "directly connected" or "connected via an intermediate element." The meaning of these terms in the present disclosure shall be construed in light of the specific context. In addition, unless otherwise specified, in the following description, "a plurality of" or "several" means "two or more than two."

Figure 1:
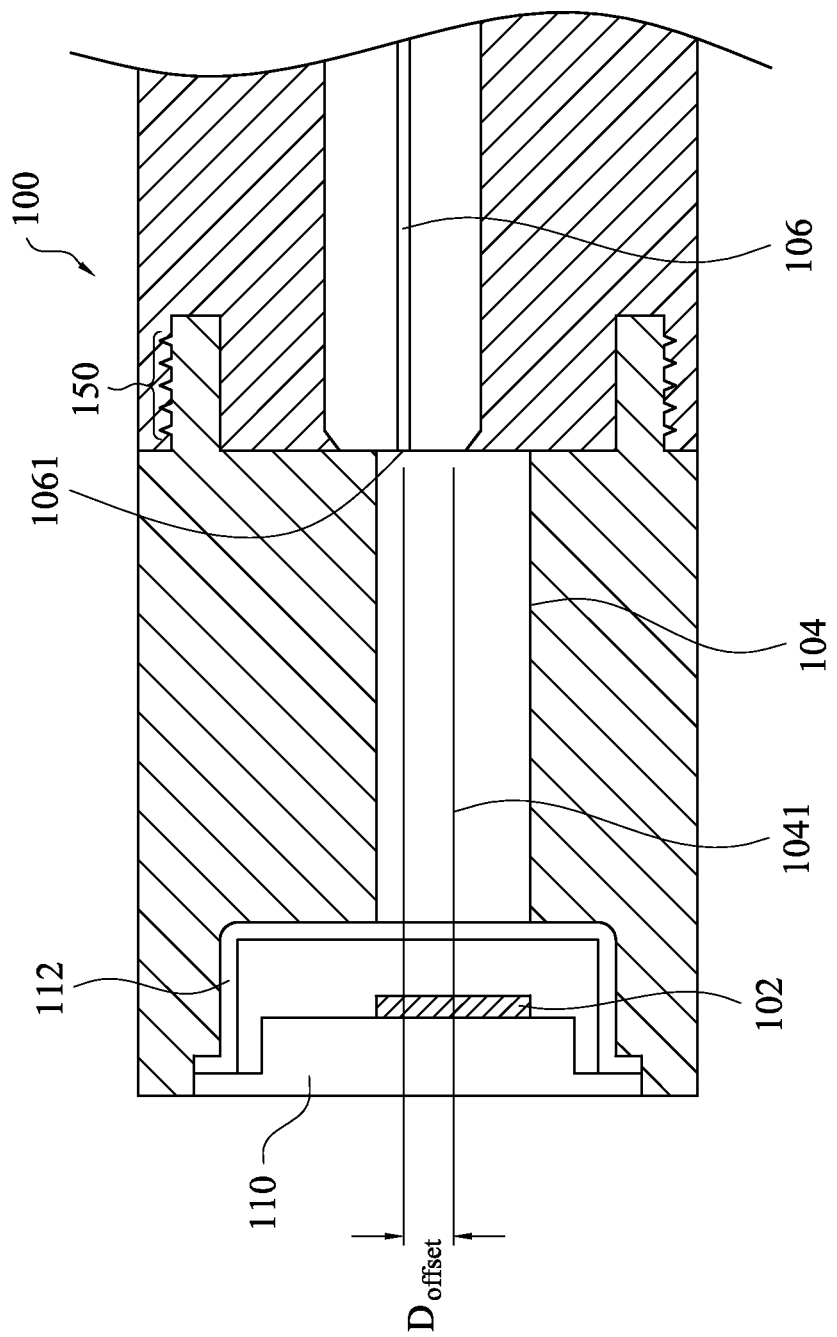
FIG. 1 is a schematic cross-sectional view of a photovoltaic power converter receiver according to an embodiment of the present disclosure.

FIG. 1 is a schematic cross-sectional view of a photovoltaic power converter receiver according to an embodiment of the present disclosure. As shown in FIG. 1, a photovoltaic power converter receiver 100 includes a photovoltaic cell 102, a waveguide 104 coupled to the photovoltaic cell 102, and an optical transmission device 106 of which an end 1061 is coupled to the waveguide 104 for transmitting an optical wave to the photovoltaic cell 102 through the waveguide 104. The photovoltaic cell 102 and the waveguide 104 will be described in detail later in the following paragraphs. The optical transmission device 106 can be, for example, an optical fiber. Specifically, the optical transmission device 106 can be a laser fiber with a typical numerical aperture (NA) between 0.08 and 0.27, and a typical core size between 9 μm and 400 μm. It is noted that the end 1061 of the optical transmission device 106 is offset from (i.e., not aligned with) a longitudinal central axis 1041 of the waveguide 104 by a distance $D_{offset}$. As a result, the central axis of a centrally peaked beam emitted from the optical transmission device 106 is offset from the longitudinal central axis 1041 of the waveguide 104 by the distance $D_{offset}$. Furthermore, in some embodiments, the optical transmission device 106 is movable along a direction parallel to the longitudinal central axis 1041 of the waveguide 104. In other words, the distance from the end 1061 of the optical transmission device 106 to the light receiving plane of the photovoltaic cell 102 may be field or factory adjustable to account for variations in beam profile, which may depend on fiber types, lengths, core sizes, fiber bends in installation, as well as laser sources. This field or factory adjustability can be accomplished by, for example, incorporating a threaded portion 150 into the photovoltaic power converter receiver 100 and allows for further optimization of beam uniformity at the outlet of the waveguide, when system implementations or applications vary from design parameters.

The photovoltaic cell 102 in the present embodiment can be any existing photovoltaic cell (also known as "solar cell") such as those fabricated on bulk silicon (monocrystalline or polycrystalline), on cadmium telluride (CdTe) thin film, on copper indium gallium selenide (CIGS) thin film, on amorphous silicon (a-Si) thin film, and on gallium arsenide (GaAs) thin film. A vertical multi-junction photovoltaic cell (VMJ cell) is taken as an example in the following description for its capability of outputting a higher voltage (>30V) and higher power (>20 W) as compared to other conventional photovoltaic cells.

Figure 2:
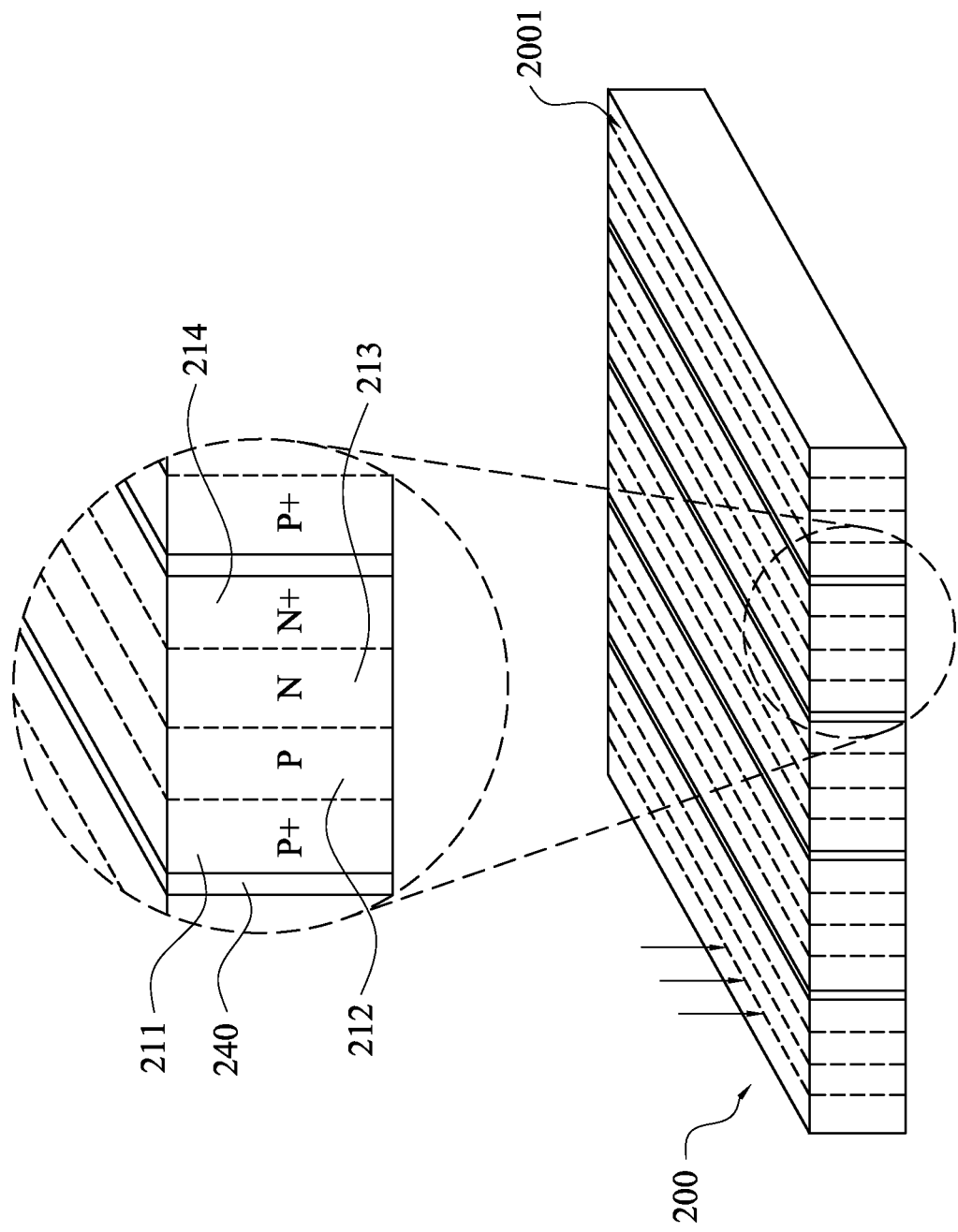
FIG. 2 illustrates a schematic perspective view of a vertical multi-junction (VMJ) photovoltaic cell in accordance with an embodiment of the present disclosure.

FIG. 2 illustrates a schematic perspective view of a VMJ cell in accordance with an embodiment of the present disclosure. As shown in FIG. 2, the VMJ cell 200 includes plural PN junction substrates 2001. Each of the PN junction substrates 2001 includes a P+ type diffuse doping layer 211, a P-type diffuse doping layer 212, an N-type diffuse doping layer 213, and an N+ type diffuse doping layer 214. Two adjacent PN junction substrates 2001 are connected by an electrode layer 240. The VMJ cell 200 may further include a passivation layer (not shown in the figures) for reducing the carrier recombination probability. The VMJ cell 200 can be, for example, identical to the one described in the U.S. patent application Ser. No. 14/186,457 filed on Feb. 21, 2014, the content of which is hereby incorporated by reference and made a part of this specification.

Although incorporating a VMJ cell into the photovoltaic power converter receiver provides benefits described above, it also produces some unpredicted problems. A VMJ cell typically has plural PN junctions (for example, the one depicted in FIG. 2 has 5 PN junctions). The normal operation of the VMJ cell requires that all of the junctions in a cell are uniformly irradiated. However, the radiation emitter used in photovoltaic power conversion application often provides a radiation beam having a non-uniform intensity profile. When, for example, a VMJ cell is directly irradiated by a laser beam with a centrally peaked intensity profile such as a "Gaussian laser beam," different junctions of the VMJ cell are likely to receive radiation of different intensity, and the power conversion efficiency is therefore unsatisfactory. Moreover, as can be seen in FIG. 2, a VMJ cell has a square light-receiving plane (incoming light indicated by the arrows), common radiation sources on the other hand produce circular spot. Beam shaping thus could be necessary for achieving uniform irradiation.

Referring back to FIG. 1, to deal with the above-identified problems, the end 1061 of the optical transmission device 106 is offset from the longitudinal central axis 1041 of the waveguide 104 by a distance $D_{offset}$. The optical wave entering into the waveguide 104 undergoes single or multiple reflections and accordingly leaves the waveguide 104 with a uniform intensity profile. This arrangement also allows placement of the cell in a location not centered on the central axis of the laser beam. The offset maintains uniformity over the cell and allows the center point of the cell to shift away from the central axis of the laser beam. This results in a potentially smaller package while using a larger photovoltaic cell, which may maintain the power levels at lower surface temperatures of the photovoltaic cell (more heat spread out).

The inner wall of the waveguide 104 can be coated with a metallic material such as gold to improve the reflectivity. Additionally, in some embodiments, the optical transmission device 106 can be a combination of a round optic fiber and a rectangular optic fiber, with the former transmitting an optical wave from the radiation source such as a laser diode to the later, and the later generating a homogenized rectangular image over the photovoltaic cell 102. In some other embodiments, depending on the geometry of the photovoltaic cell 102, the rectangular optic fiber may be a square optic fiber.

In FIG. 1, the photovoltaic cell 102 is attached to a header 110 and is hermetically sealed in a cap 112. The photovoltaic cell 102 can be attached to the header 110 via adhesive such as thermal epoxy. The cap 112 includes a unit providing a pathway for the optical wave to arrive at the photovoltaic cell 102. For example, the cap 112 may be made of semitransparent or transparent material, or the cap 112 may include semitransparent or transparent window, or lens. If the cap 112 includes a refractive lens, it can further assist in homogenizing the light over the photovoltaic cell 102. The header 110 together with the cap 112 may constitute a TO-CAN package. In other embodiments, the photovoltaic cell 102 can be packaged by another conventional technique, for example, the photovoltaic cell 102 can be mounted on a header without a cap, and then be hermetically sealed in a housing; or the hermetic seal may be accomplished using optical glues or transparent epoxies, as examples. The structure shown in FIG. 1 then can be mounted on a heat sink (not shown in FIG. 1, please refer to FIGS. 6 and 7 for examples of a heat sink) to dissipate the heat generated during energy conversion. It is noted that the material and the fabrication method of each of the photovoltaic cell 102, the waveguide 104, the header 110, and the cap 112 are known to persons having ordinary skills in the relevant art, and therefore these details are skipped herein for brevity.

Figure 3:
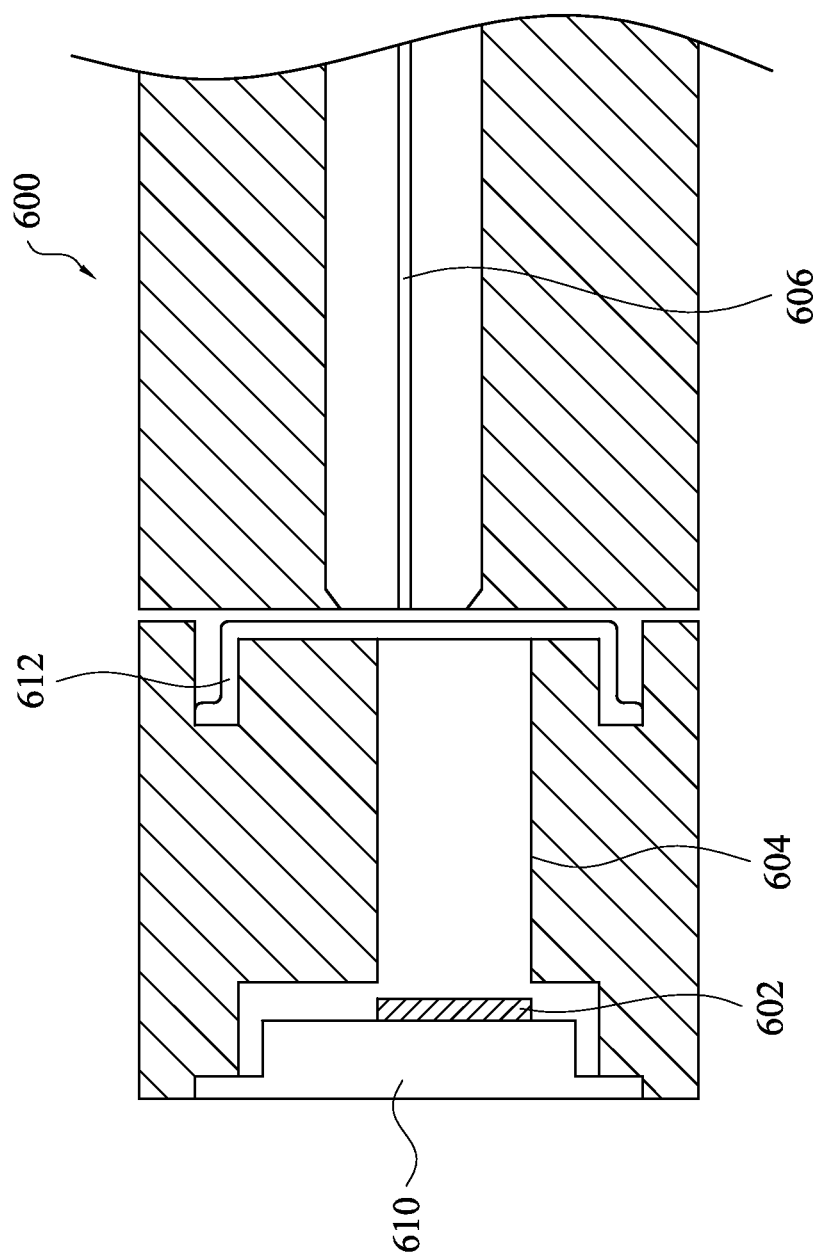
FIG. 3 is a schematic cross-sectional view of a photovoltaic power converter receiver according to an embodiment of the present disclosure.

The arrangement of the photovoltaic cell, the waveguide, and the cap may be changed in other embodiments. For example, FIG. 3 is a schematic cross-sectional view of a photovoltaic power converter receiver according to an embodiment of the present disclosure. Referring to FIG. 3, the photovoltaic power converter receiver 600 includes a photovoltaic cell 602, a waveguide 604, an optical transmission device 606, a header 610, and a cap 612. The waveguide 604 is disposed between the cap 612 and the header 610 so that a hermetic seal is formed between the cap 612, the waveguide 604, and the header 610. This would allow the outlet of the waveguide 604 to be placed closer to the photovoltaic cell 602 yet still be hermetically sealed using known fabrication methods. Other embodiments include a window on the top of the waveguide that was a refractive optic, or a cap that embedded an optical transmission device such as optical fiber into its material, allowing the light output from the optical transmission device 106 to pass freely to the waveguide 104 without first passing through the window.

It is also noted that, in FIGS. 1 and 3, there is only one photovoltaic cell receiving the optical wave transmitted by the waveguide. However, the present disclosure is not limited to this configuration. In other embodiments, there may be multiple photovoltaic cells, with or without a common ground, disposed at the outlet of the waveguide, so as to provide multiple output voltages for the desired applications. The multi-cell arrangement is described in the U.S. patent application Ser. No. 14/753,515 filed on Jun. 29, 2015, the content of which is hereby incorporated by reference and made a part of this specification.

Figure 4A:
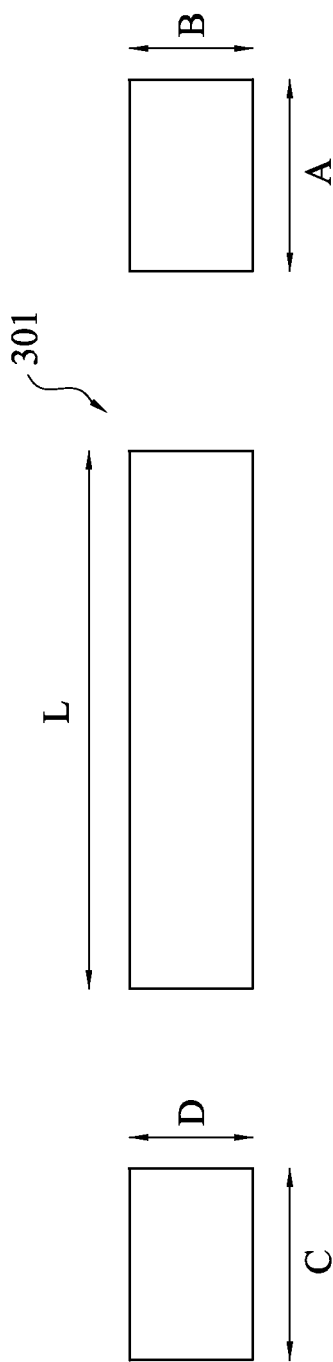
FIG. 4A shows contours of an inner wall, an inlet and an outlet of an exemplary waveguide in a photovoltaic power converter receiver according to an embodiment of the present disclosure.
Figure 4B:
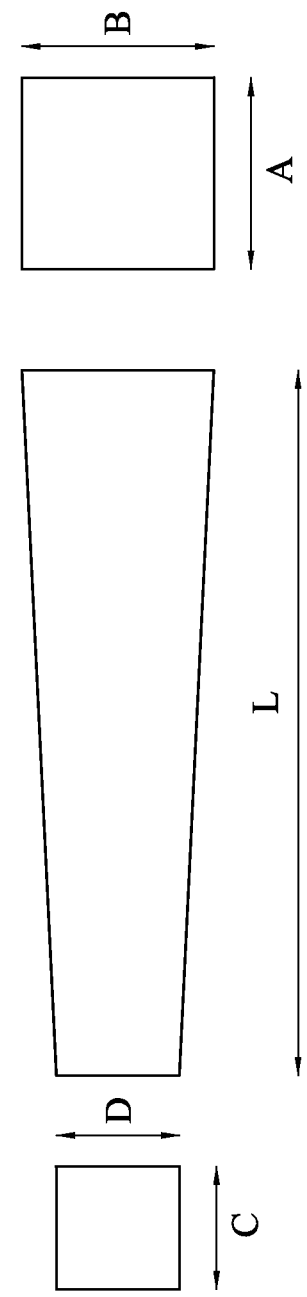
FIG. 4B shows contours of an inner wall, an inlet and an outlet of an exemplary waveguide in a photovoltaic power converter receiver according to an embodiment of the present disclosure.

In addition to offsetting the waveguide from the centerline of, for example, a laser beam, another approach for homogenizing the light impacting on a photovoltaic cell is to optimize the dimension of the waveguide. FIG. 4A and FIG. 4B each show contours of an inner wall, an inlet, and an outlet of an exemplary waveguide in a photovoltaic power converter receiver according to an embodiment of the present disclosure. It is noted that the waveguides shown in FIG. 4A and FIG. 4B may be combined with the aforementioned optical transmission device, in which the end of the optical transmission device is offset from or aligned with the longitudinal central axis of the waveguide.

As shown in FIG. 4A, the middle portion of the figure shows a cross-sectional view of a contour of the inner wall of an exemplary waveguide 301, while the left and right portions thereof show the respective contours of inlet and the outlet viewed along the longitudinal central axis of the waveguide 301. An inlet width of the waveguide 301, an inlet height of the waveguide 301, an outlet width of the waveguide 301, an outlet height of the waveguide 301, and a longitudinal length of the waveguide 301 are defined as A, B, C, D, and L, respectively. As shown in FIG. 4A, A is greater than B and C is greater than D, meaning that the waveguide 301 has a rectangular inlet cross section and a rectangular outlet cross-section. The exact shape of the inlet cross section or the outlet cross section depends on the size, the number, and the arrangement of the photovoltaic cell(s) disposed at the outlet of the waveguide 301. In addition, A is equal to C and B is equal to D, meaning that the area of the rectangular inlet cross-section is substantially equal to that of the rectangular outlet cross-section. L may range from 2×A to 5×A.

Please refer to FIG. 4B for another embodiment. The middle portion of FIG. 4B shows a cross-sectional view of a contour of an inner wall of an exemplary waveguide 302, while the left and right portions show the contours of an inlet and an outlet viewed along the longitudinal central axis of the waveguide 302. An inlet width of the waveguide 302, an inlet height of the waveguide 302, an outlet width of the waveguide 302, an outlet height of the waveguide 302, and a longitudinal length of the waveguide 302 are again defined as A, B, C, D, and L, respectively. As shown in FIG. 4B, A is equal to B and C is equal to D, meaning that the waveguide has a square inlet cross section and a square outlet cross section. In addition, A is greater than C and B is greater than D, meaning that the area of the rectangular inlet cross-section is greater than that of the rectangular outlet cross-section. L may still range from 2×A to 5×A in this embodiment.

Figure 5:
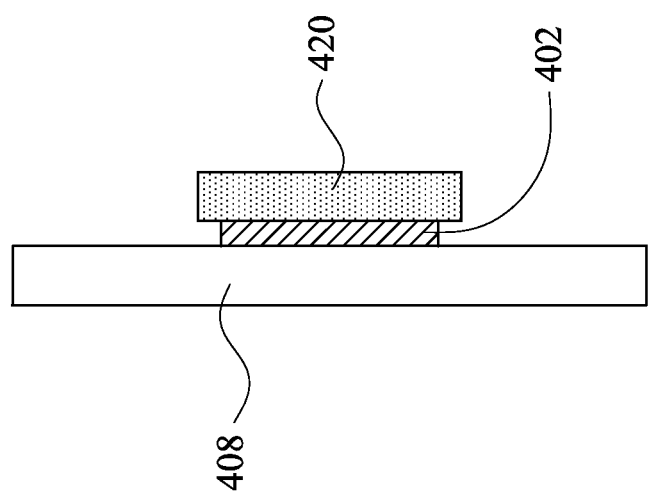
FIG. 5 illustrates a schematic partial view of a photovoltaic power converter receiver having a optical diffuser according to an embodiment of the present disclosure.

FIG. 5 illustrates a schematic partial view of a photovoltaic power converter receiver having an optical diffuser according to an embodiment of the present disclosure. As shown in FIG. 5, the photovoltaic power converter receiver includes a photovoltaic cell 402, a substrate 408 to which the photovoltaic cell 402 is attached, and an optical diffuser 420 disposed on a light-receiving plane of the photovoltaic cell 402. The substrate 408 can be, for example, aluminum-nitride circuit board. The photovoltaic power converter receiver of FIG. 5 may further include one or more elements described above such as the waveguide and the optical transmission device. The photovoltaic cell 402 and the optical diffuser 420 can be hermetically sealed in a package. Materials forming the optical diffuser 420 may include, for example, glass or polymers, with or without functional fine particles dispersed therein. Likewise embossed patterns or textures can be incorporated to aid in the diffusion of the light. The optical diffuser 420 can evenly spread light across the light-receiving plane of the photovoltaic cell 402.

Figure 6:
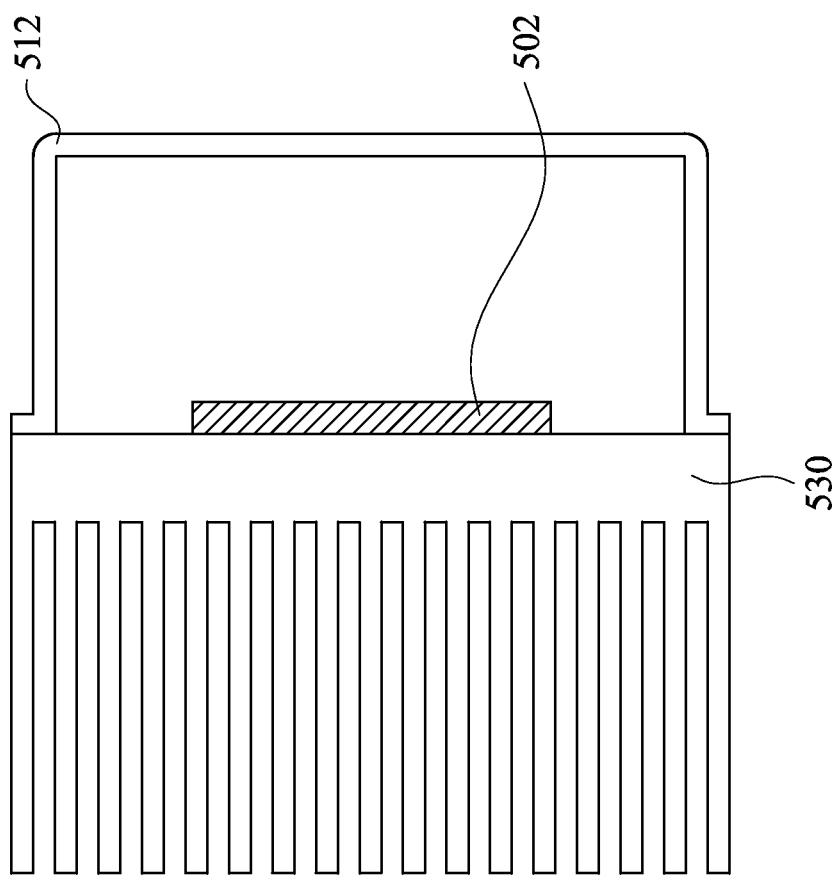
FIG. 6 illustrates a schematic partial view of a photovoltaic power converter receiver having a heat sink according to an embodiment of the present disclosure.

FIG. 6 illustrates a schematic partial view of a photovoltaic power converter receiver having a heat sink according to an embodiment of the present disclosure. As shown in FIG. 6, the photovoltaic power converter receiver includes a photovoltaic cell 502, a heat sink 530 to which the photovoltaic cell 502 is directly attached, and a cap 512 hermetically sealing the photovoltaic cell 502. The photovoltaic power converter receiver of FIG. 6 may further include one or more elements described above such as the waveguide, the optical transmission device, and the optical diffuser, etc. Furthermore, as discussed, any aforementioned waveguide and the cap 512 may be integrated into the same element. The heat sink 530 is shown as a "straight fin" heat sink in FIG. 6, but the present disclosure is not limited thereto. The heat sink in other embodiments can be a pin fin heat sink, a flared fin heat sink, or a cold plate if water cooling is available (for example, see FIG. 7). The construction of FIG. 6 eliminates the header which is a necessary element in a conventional packaging, thereby resulting in better heat transfer by reducing the number of thermal interfaces.

Figure 7:
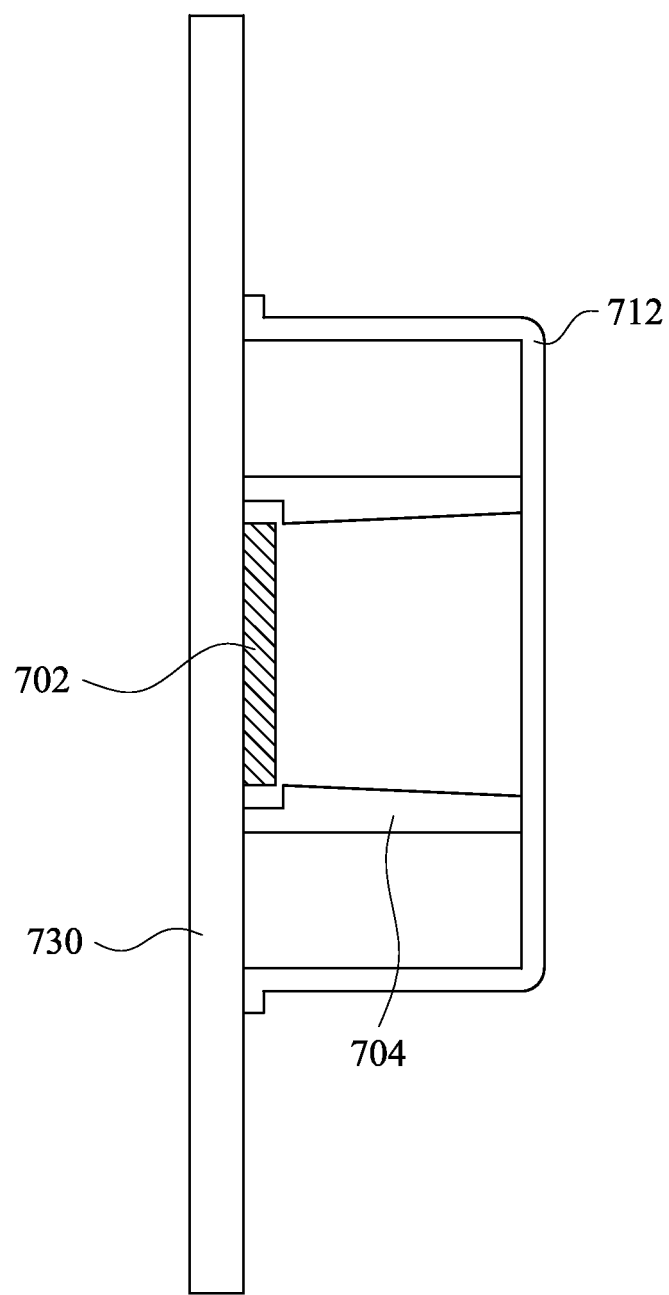
FIG. 7. illustrates a schematic partial view of a photovoltaic power converter receiver according to an embodiment of the present disclosure.

FIG. 7 illustrates a schematic partial view of a photovoltaic power converter receiver according to an embodiment of the present disclosure. As shown in FIG. 7, the photovoltaic power converter receiver includes a photovoltaic cell 702, a heat sink 730 (a cold plate in this embodiment) to which the photovoltaic cell 702 is directly attached, and a cap 712 attached to the heat sink 730 so as to hermetically seal the photovoltaic cell 702. The photovoltaic power converter receiver of FIG. 7 further includes a waveguide 704 inside of the hermetic seal between the cap 712 and the heat sink 730. The waveguide 704 can be the only waveguide in the photovoltaic power converter receiver of FIG. 7, or it can be an additional waveguide, for example, the components shown in FIG. 7 can be incorporated into a photovoltaic power converter receiver shown in FIG. 1.

It is also noted that, throughout the description a waveguide is adopted as a beam homogenizer disposed between an optical transmission device and a photovoltaic cell. The waveguide however is just one kind of beam homogenizer. Alternatives such as lenses, micro-lens array, light rod, diffractive optical element (DOE), etc. can also work. Furthermore, fiber based flat top beam shaping techniques coupled to various fiber geometries can be used to generate the output of the optical transmission device. The present disclosure is intended to cover these alternatives.

Although the present disclosure has been described in detail, it should be understood that various changes, substitutions and alterations can be made herein without departing from the spirit and scope of the disclosure as defined by the appended claims. Moreover, the scope of the present disclosure is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or step.

What is claimed is:

1. A photovoltaic power converter receiver, comprising:
    a vertical multi junction (VMJ) photovoltaic cell;
    a waveguide coupled to the photovoltaic cell configured to transmit an optical wave along a longitudinal dimension of the waveguide; and
    an optical transmission device configured to transmit the optical wave along a longitudinal dimension of the optical transmission device,
    wherein an end of the optical transmission device is coupled to an end of the waveguide for transmitting the optical wave from the optical transmission device to the photovoltaic cell along the longitudinal dimensions of the waveguide and the optical transmission device,
    wherein the longitudinal dimension of the waveguide is parallel with the longitudinal dimension of the optical transmission device, and
    wherein a longitudinal central axis of the optical transmission device is offset from a longitudinal central axis of the waveguide by a distance $D_{offset}$.

2. The photovoltaic power converter receiver of claim 1, further comprising a header to which the photovoltaic cell is attached.

3. The photovoltaic power converter receiver of claim 2, further comprising a cap, wherein a hermetic seal is formed between the cap and the header.

4. The photovoltaic power converter receiver of claim 3, wherein the cap comprises a unit providing a pathway for the optical wave to arrive at the photovoltaic cell.

5. The photovoltaic power converter receiver of claim 3, wherein the waveguide is disposed between the cap and the header so that the hermetic seal is formed between the cap, the waveguide, and the header.

6. The photovoltaic power converter receiver of claim 1, wherein the waveguide has a rectangular inlet cross-section and a rectangular outlet cross-section.

7. The photovoltaic power converter receiver of claim 6, wherein an area of the rectangular inlet cross-section is substantially equal to or greater than an area of the rectangular outlet cross-section.

8. The photovoltaic power converter receiver of claim 1, wherein the optical transmission device is movable along a direction parallel to the longitudinal central axis of the waveguide.

9. The photovoltaic power converter receiver of claim 1, further comprising an optical diffuser disposed on a light-receiving plane of the photovoltaic cell.

10. The photovoltaic power converter receiver of claim 1, wherein the optical transmission device is a rectangular optic fiber.

11. The photovoltaic power converter receiver of claim 1, wherein the photovoltaic power converter receiver is mounted on a heat sink.

12. The photovoltaic power converter receiver of claim 11, further comprising a cap, wherein a hermetic seal is formed between the cap and the heat sink.

13. The photovoltaic power converter receiver of claim 1, wherein:
    the photovoltaic cell comprises a plurality of PN junctions along a first dimension of the photovoltaic cell, and
    a primary axis of the optical wave transmitted through the waveguide is incident to the photovoltaic cell orthogonal to the first dimension.

14. The photovoltaic power converter receiver of claim 1, wherein the optical wave transmitted through the waveguide uniformly irradiates a plurality of PN junctions of the photovoltaic cell.

* * * * *